United States Patent [19]

Smith et al.

[11] 3,779,778

[45] Dec. 18, 1973

[54] PHOTOSOLUBILIZABLE COMPOSITIONS AND ELEMENTS

[75] Inventors: George H. Smith, Saint Paul; James A. Bonham, Pine Springs, both of Minn.

[73] Assignee: Minnesota Mining and Manufacturing Company, St. Paul, Minn.

[22] Filed: Feb. 9, 1972

[21] Appl. No.: 224,918

[52] U.S. Cl. ............... 96/115 R, 96/85 R, 96/86 R, 96/87 R, 96/35.1

[51] Int. Cl. ............... G03c 1/68

[58] Field of Search ............... 96/115 R, 115 P, 96/85, 33, 35.1, 86, 87

[56] References Cited

UNITED STATES PATENTS

| | | | |
|---|---|---|---|
| 3,515,552 | 6/1970 | Smith | 96/115 P |
| 3,558,311 | 1/1971 | Delzenne et al. | 96/115 R |
| 3,201,239 | 8/1965 | Neugebauer et al. | 96/33 |
| 3,046,119 | 7/1962 | Sus | 96/33 |
| 2,767,092 | 10/1956 | Schmidt | 96/33 |
| 3,536,489 | 10/1970 | Smith | 96/115 R |

*Primary Examiner*—Norman G. Torchin
*Assistant Examiner*—Edward C. Kimlin
*Attorney*—Alexander, Sell, Steldt & Delahunt

[57] ABSTRACT

Novel photosolubilizable compositions and their preparation are described. These compositions comprise (1) a water-insoluble compound containing one or more acid-degradable groups, and (2) a photoinitiator comprising a photolyzable acid progenitor. Presensitized elements utilizing these photosolubilizable compositions are also provided.

25 Claims, No Drawings

PHOTOSOLUBILIZABLE COMPOSITIONS AND ELEMENTS

FIELD OF THE INVENTION

This invention relates to novel photosolubilizable compositions and to presensitized elements utilizing these compositions.

BACKGROUND OF THE INVENTION

In the making of photosensitive elements, such as lithographic plates, photoresists, and the like, photosensitive compositions are used which are either negative-acting (i.e., photoinsolubilizable) or positive-acting (i.e., photosolubilizable). Negative-acting photosensitive compositions are those which become insolubilized in an imagewise manner upon exposure thereof to actinic radiation. Since exposed areas are relatively insoluble, selected developing solutions can dissolve or otherwise remove the unexposed portions of the composition or element while leaving the exposed areas intact. Thus, development of the exposed element yields an image corresponding to the reverse of the original in terms of contrast, i.e., development of the exposed element yields a negative image. Conversely, with photosolubilizable or positive-acting photosensitive compositions or elements the exposed portions thereof are rendered soluble or developable by actinic radiation and thus can be removed with selective developing solutions, while the unexposed portions remain intact. Thus imagewise exposure of a photosolubilizable composition, followed by developing, yields an image corresponding to the original image, i.e., yields a positive image.

Some photosolubilizable compositions are known in the art. Examples of such compositions include those containing naphthoquinone diazide as a photosensitive compound, as are disclosed in U.S. Pat. Nos. 3,046,121, 2,767,092, 3,180,733, and 3,201,239; photosensitive compositions containing derivatives of quinone diazide as are disclosed in U.S. Pat. Nos. 3,046,119, 3,046,112, and 2,907,655; photosensitive compositions containing derivatives of quinoline quinone diazide as are described in U.S. Pat. No. 2,859,112; diazo resins as are described in U.S. Pat. Nos. 3,136,636 and 3,085,008; and azide polymers as are described in U.S. Pat. Nos. 3,100,702 and 3,113,023. These compositions, however, are generally limited in their spectral sensitivity and this sensitivity is not broadened by conventional dye-sensitization techniques. Furthermore, quantum yields of the foregoing compositions have maximum values of 1.0, i.e., no more than one molecule of photosensitive composition reacts per quanta of actinic light absorbed.

This invention provides novel photosolubilizable compositions and photosensitive elements prepared therefrom which are sensitive throughout the ultraviolet and visible spectral regions commonly used for imaging, i.e., wavelengths of about 300 to about 700 millimicrons, and are capable of catalytic reactivity and therefore higher quanta efficiencies than the prior art photosolubilizable compositions.

SUMMARY OF THE INVENTION

In accordance with the invention there are provided photosolubilizable compositions which are readily removable by developing solutions in areas exposed to actinic radiation, the compositions comprising:

a. water-insoluble organic compound containing one or more acid-degradable linkages of the general formula

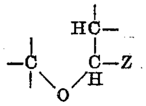

where Z is selected from the group consisting of —OAr, —$NRSO_2Ar$,

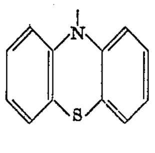

, and

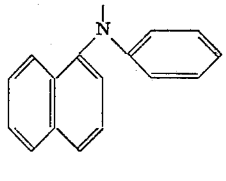

where Ar is a monovalent or divalent aromatic group and R is a lower alkyl group; and b. a normally substantially neutral and stable photolyzable acid progenitor which upon exposure to actinic radiation generates an acidic condition.

Water-insoluble organic compounds containing one or more acid-degradable linkages of the above formula can be (1) nonpolymeric, (2) polymeric, wherein the acid-degradable linkages are contained within the polymeric backbone, or (3) polymeric, wherein the acid-degradable linkages are pendant to the polymeric backbone.

The image-recording photosolubilization reactions occur at surprisingly high reaction rates when the composition is in the dry state, and sufficient chemical and physical changes are produced in the dry composition to impart solubility or dispersibility to the exposed areas. Thus, developing solutions can dissolve or readily remove exposed areas, while unexposed areas remain intact. In some cases the exposed areas undergo sufficient physical change relative to unexposed areas that exposed areas may be effectively removed with a pressure-sensitive adhesive or by pressure transfer to another surface such as film, paper, or metal. The novel compositions are thus ideally suited for producing positive acting lithographic plates, color proofing transparencies, color visuals, photoresists, and the like.

DETAILED DESCRIPTION OF THE INVENTION

Solubilization in image-exposed areas of the photosolubilizable composition occurs by reason of two chemical processes. Initially, upon exposure of the composition to actinic radiation of wavelength from about 300 to about 700 millimicrons, direct or dye-sensitized photolysis of the photolyzable acid progenitor occurs, thereby producing an acidic condition in irradiated areas. Next, the acid catalyzes the decomposition of the acid-degradable linkages, resulting in the formation of products which are selectively soluble or dispersible relative to the unexposed parent material.

The useful water-insoluble organic compounds contain one or more acid-degradable linkages which can be depicted by the formula

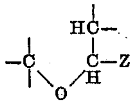

where Z is selected from the group consisting of —OAr, —$NRSO_2Ar$,

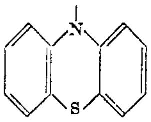

, and

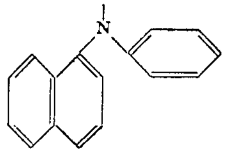

where Ar is a monovalent or divalent aromatic group and R is a lower alkyl group (In all formulas where an R is designated to be a lower alkyl group, lower alkyl signifies no more than about four carbon atoms, which can be branched or unbranched). Water-insoluble compounds containing acid-degradable linkages can in general be prepared by the nucleophilic addition reaction of (1) organic compounds containing one or more vinyl ether groups with (2) organic compounds containing one or more aromatic hydroxyl groups, aromatic monoalkylsulfonamide groups, i.e., —$RNHSO_2Ar$ where R is a lower alkyl group and Ar is a monovalent or divalent aromatic group, or the secondary aromatic amines phenothiazine or α-naphthylphenylamine.

The water-insoluble organic compounds containing these linkages are essentially neutral, i.e., neither acidic nor basic. The compounds can be aliphatic or aromatic and may contain constituents of each. The compounds typically can be amides, urethanes, esters, ethers, non-basic amines, and ureas. Generally, the compounds can contain one acid-degradable linkage for approximately each one thousand molecular weight units, but this is subject to the chemical nature of the chain between acid-degradable linkages or groups. For example, if the chain between the acid-degradable linkages or groups is completely non-polar, then the molecular weight of the chain between acid-degradable linkages may be considerably less than a thousand. If the chain between the acid degradable linkages is highly polar (i.e., the chain contains highly polar substituents such as carboxy, hydroxy, carbonyl, ether, thioether, amino, aldehyde, sulfonamide, oxyether, or is highly polar because of a high ratio of oxygen, nitrogen, or sulfur to carbon) then the molecular weight of the chain between acid-degradable linkages is normally considerably greater than is the case for completely non-polar chains between acid-degradable linkages.

The Z group in the above formula may be linked to another Z group of a neighboring acid-degradable linkage in the same water-insoluble compound by, e.g., a covalent carbon-to-carbon bond, —$SO_2$—, —NH—, —O—, or —$(CH_2)_a$— where a is a positive integer. There may also be sharing of the atoms in a single Z group by two or more acid-degradable linkages in the same water-insoluble compound.

A particularly suitable class of compounds containing one or more acid-degradable linkages within the general formula indicated above are those compounds prepared by the nucleophilic addition reaction of organic compounds containing one or more alkyl vinyl ether groups with the compounds under (2) above. The resulting acid-degradable groups within the reaction product can be generally depicted by the formula

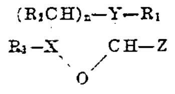

where n is zero, 1, 2, or 3; wherein when n is zero, X and Y are —$CH_2$— and $R_1$ is hydrogen or lower alkyl; and when n is 1, 2, or 3, X and Y are —CH—, $R_1$ is hydrogen, and $R_2$ is hydrogen or lower alkyl; and wherein $R_3$ is hydrogen, a monovalent aliphatic radical, or a divalent organic radical; and Z is as defined above.

When $R_3$ is a divalent organic radical it serves to link one acid-degradable group to another. Typical of such divalent organic radicals are ether linkages, ester linkages, urethane linkages, amide linkages, non-basic amino linkages, and urea linkages.

Suitable compounds containing one vinyl ether group include the alkyl vinyl ethers (e.g., methyl vinyl ether, ethyl vinyl ether, isobutyl vinyl ether, and the like) and the dihydropyrans (e.g., dihydropyran, 2-methyl-2H-3,4-dihydropyran, 4-ethyl-2H-3,4-dihydropyran, 4-phenyl-2H-3,4-dihydropyran, and the like).

Examples of compounds containing more than one vinyl ether group that are useful in preparing the acid-degradable compounds of the invention include the vinyl ethers of polyhydric alcohols, e.g., ethylene glycol divinyl ether, glycerol trivinyl ether, butane diol divinyl ether, hexanediol divinyl ether, pentaerythritol tetravinyl ether; and the divinyl ethers of polyalkylene glycols. These vinyl ethers are in general prepared by the reaction of acetylene with the corresponding alcohol or polyhydric compound in the presence of a base, such as potassium hydroxide, in accordance with methods known in the art.

Examples of preferred compounds containing more than one vinyl ether group useful for the preparation of the acid-degradable materials include bis-dihydropyran derivatives, such as those indicated below:

1.

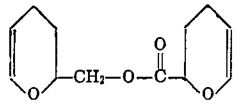

2.

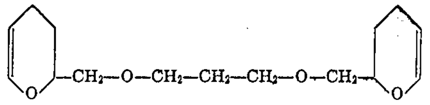

3.

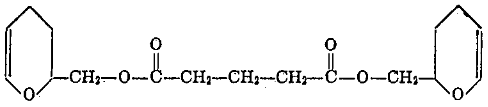

4.

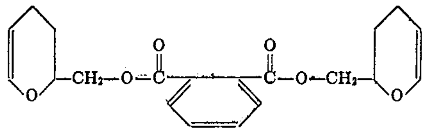

5.

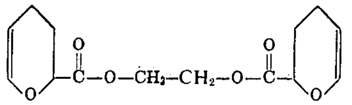

6.

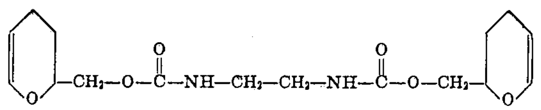

7.

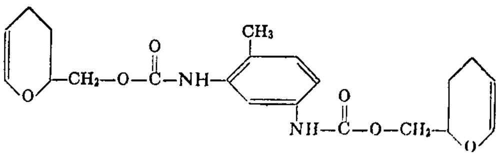

8.
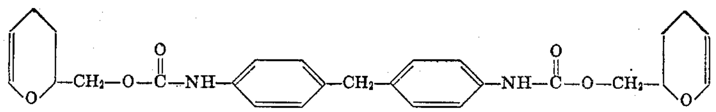

9.
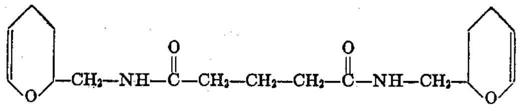

10.
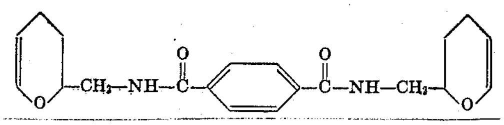

The above-described compounds may be prepared by a variety of methods. Compound 1 is prepared by mixing 3,4-dihydro-2H-pyran-2-carboxaldehyde with a small amount of aluminum isopropoxide and maintaining the mixture at 20° C. to about 70° C. as taught in U.S. Pat. No. 2,537,921. Compound 2 and related ethers may be prepared by the reaction of the alkali metal alcoholate of 2-hydroxymethyl-3,4-dihydro-2H-pyran with suitable dihalides. Compounds 3 and 4 and reacted esters may be prepared by the reaction of 2-hydroxy-methyl-3,4-dihydro-2H-pyran with suitable dicarboxylic acids, halides, or anhydrides. Compound 5 and related esters may be prepared from the reaction of 3,4-dihydro-2H-pyran-2-carboxylic acid with suitable dihydric alcohols and phenols. Compounds 6, 7 and 8 and related urethanes may be prepared by the reaction of 2-hydroxymethyl-3,4-dihydro-2H-pyran with suitable diisocyanates. Compounds 9 and 10 and related amides may be prepared by the reaction of 2-aminoethyl-3,4-dihydro-2H-pyran with suitable dicarboxylic acids, halides or anhydrides, as is taught in U.S. Pat. No. 3,431,283.

Compounds containing one or more aromatic hydroxyl groups useful in the preparation of the acid-degradable materials of use in the compositions of the invention are phenols and polyhydric phenols, examples of which include: phenol, cresols, xylenols, pyrocatechol, resorcinol, hydroquinone, guaiacol, orcinol, pyrogallol, phloroglucinol, 1,2,4,5-tetrahydroxybenzene, 2,2'-dihydroxybiphenyl, 2,2',4,4'-tetrahydroxybiphenyl, 2,3-dihydroxynaphthalene, 4,4'-isopropylidenediphenol, 4,4'-oxydiphenol, 4,4'-sulfonyldiphenol and others.

Useful aromatic monoalkylsulfonamide compounds include, among others, N-methylbenzenesulfonamide, N-phenyl-benzenesulfonamide, N,2-dimethylbenzenesulfonamide, N-methyl, 2-trifluoromethylbenzenesulfonamide, N,2,4-trimethylbenzenesulfonamide, N,N'-dimethyl-1,4-benzenedisulfonamide, N,N'-dimethyl-1,2-benzenedisulfonamide, N,N'-1-trimethyl-2,4-benzenedisulfonamide, N,N'-dimethyl, bis [ 4-(N-methylsulfonamido)phenyl ] methane, and 4,4'-bis(N-methylsulfonamido) diphenyl.

Secondary aromatic amines useful for preparation of the acid-degradable compounds include phenothiazine and α-naphthylphenylamine.

The addition reaction of vinyl ether-containing compounds and aromatic hydroxyl- or monoalkylsulfonamide-containing compounds or the secondary aromatic amines phenothiazine and α-naphthylphenylamine are usually carried out under anhydrous conditions with catalytic amounts of a strong acid, such as hydrogen chloride, boron trifluoride, or toluenesulfonic acid. These are generally 1:1 addition reactions and are well known in the art; see, for example, Journal of the American Chemical Society, 70, 4187–4189 (1948).

Examples of addition products described hereinabove which are of simple molecular structure, i.e., are non-polymeric, include:

1.
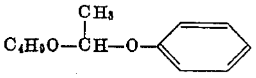

2.
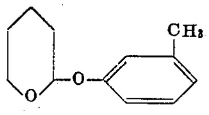

3.
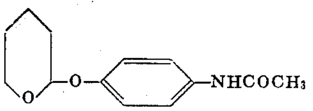

4.
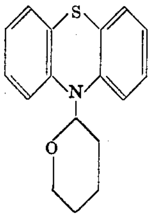

5.
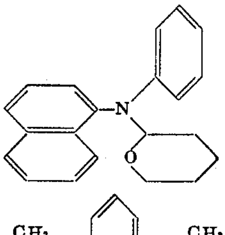

6.
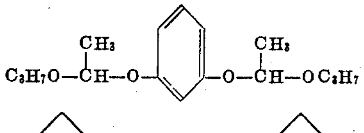

7.
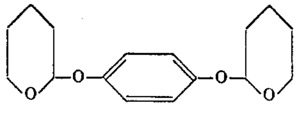

8.
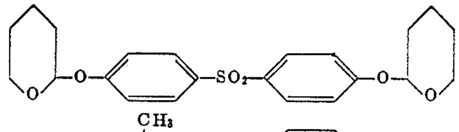

9.
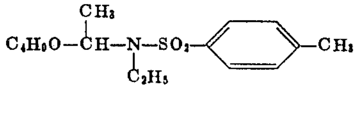

10.

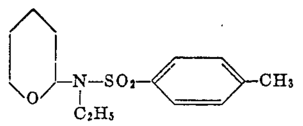

11.

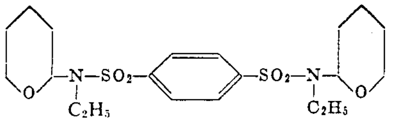

Examples of polymeric addition products wherein the acid-degradable groups are contained within the polymeric backbone include:

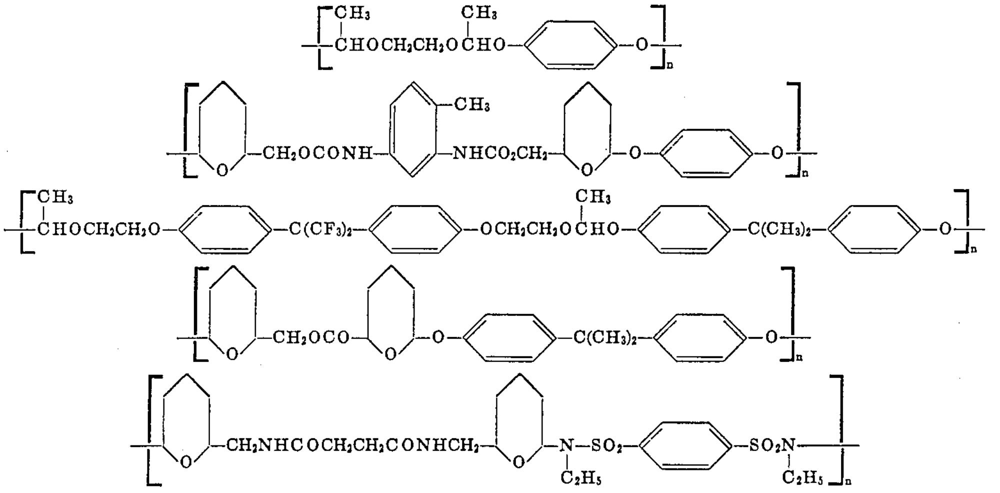

where n is from 2 to 40.

Examples of polymeric addition products containing acid-degradable groups in a pendant position are the additon products of vinyl ethers or dihydropyrans, described herein-above, with phenol-aldehyde condensation novolac resins. Examples include:

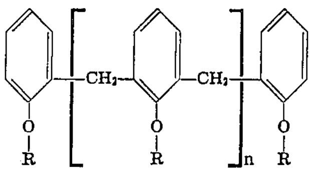

where R is

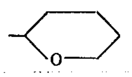

or

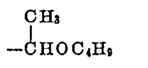

and n has a value of from 1 to about 25.

Photoinitiator compounds useful in the invention are acid progenitors which are normally substantially neutral, i.e., neither acidic nor basic, and in the absence of actinic radiation are chemically inert toward the materials containing acid-degradable groups. Additionally, they have a sufficiently low vapor pressure so as to remain in the photosolubilizable composition prior to exposure to actinic radiation and are sufficiently stable to avoid undergoing decomposition under all normal storage conditions. On exposure to actinic radiation the acid progenitor generates an acidic condition.

Examples of suitable acid progenitors include diazonium salts, which upon decomposition by exposure to actinic radiation yield an acid, e.g., a Lewis acid, such as is taught by U.S. Pat. No. 3,205,157. Preferred acid progenitors include organic halogen-containing compounds which on exposure to actinic radiation of suitable wavelength dissociate at one or more carbon-halogen bonds, generating halogen free-radicals. These free radicals in turn extract hydrogen from any available source in their environment, e.g., from a binder polymer, the acid-degradable composition, etc., to form a halogen acid. The carbon-halogen bond dissociation energy should be between about 40 and about 70 kilogram calories per mole, as is taught in U.S. Pat. Nos. 3,515,552 and 3,536,489.

Photolyzable organic halogen-containing compounds falling under this general definition include, for example, carbon tetrabromide, hexabromoethane, α, α, α-trichloroacetophenone, tribromotrichloroethane, ω, ω, ω-tribromoquinaldine, α, α, α′ α′-tetrabromo-o-xylene, the preferred halomethyl-s-triazines, e.g., 2,4-bis(trichloromethyl)-6-methyl-s-triazine, 2,4,6-tris(trichloromethyl)-s-triazine, and the more preferred chromophore substituted vinylhalomethyl-s-triazines disclosed in assign copending U.S. application Ser. No. 177,851. These are photolyzable s-triazines having at least one trihalomethyl group and at least one chromophoric moiety conjugated with the triazine ring by ethylenic unsaturation. An example is:

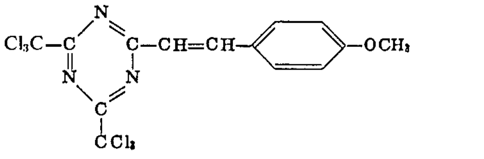

which is 2,4-bis(trichloromethyl)-6-p-methoxystyryl-s-triazine.

The photosolubilizable compositions of the invention are prepared by dissolving or dispersing in a suitable solvent the photolyzable acid progenitor and the acid-degradable material, in the range of about 1:1 to 50:1 parts by weight of acid-degradable material to acid progenitor, and preferably 5:1 to about 25:1 parts respectively. Suitable solvents include the conventional ketones, esters, aromatics, alcohols, ethers and chlorinated hydrocarbons. Elements utilizing these compositions generally are produced by solution or dispersion coating (e.g., knife coating, dip coating, roller coating, spray coating) on a base or support material. Generally, coatings from about 0.05 mils to about 25 mils in thickness may be used, with 0.5 to about 5.0 mils being preferred. It is to be understood that these operations should be undertaken utilizing normal procedures for light-sensitive materials, e.g., coating and processing under subdued light.

Useful bases or supports generally can include glass, wood, paper, cloth, plastics, and metal, and should be chosen according to the photosensitive element desired to be produced. For color-proofing transparencies, for instance, suitable supports include polyesters, e.g., polyethylene terephthalate; polyamides, e.g., polyhexamethylene adipamide; polyolefins, e.g., polyethylene and polypropylene. For photoresists or lithographic plates, metal foils or plates, e.g., copper, aluminum, zinc, brass or metal clad material provides suitable supports. Aluminum plates that have been surface treated with an alkali metal silicate solution according to the teachings of U.S. Pat. No. 2,714,066 represent a preferred support for lithographic printing plates relying on the principle of water/ink immiscibility. For dry film resists polyethylene, polypropylene, or polyester films or treated papers are suitable as supports. If desired, the base or support for the photo-solubilizable layer may be provided with conventional antihalation, anchor, or adhesive layers.

It may often be advantageous in the operation of the invention to include a film-forming binder polymer in the photosensitive composition. Where the acid-degradable material is polymeric, inclusion of such a binder polymer is usually unnecessary, however, properties such as toughness and tensile strength can be enhanced by the addition of up to about 0.5 parts by weight of binder polymer per part of polymeric acid-degradable material. Where the acid-degradable material is a simple molecule, i.e., non-polymeric, addition of 5 to about 20 or more parts by weight of binder polymer per part of acid-degradable material may be desirable to provide cohesive, uniform, tough coatings.

Suitable binder polymers include polyesters, e.g., these prepared by the reaction of a polymethylene glycol and a dicarboxylic acid such as, for example, poly(hexamethylene adipate) and poly(tetramethylene terephthalate); vinylidene chloride copolymers; e.g., vinylidene chloride/vinylacetate, vinylidene chloride/methylacrylate and vinylidene chloride/acrylonitrile; ethylene vinylacetate copolymers; cellulose ethers, e.g., methyl cellulose and ethyl cellulose; cellulose esters, e.g., cellulose acetate and cellulose acetate butyrate; polyvinyl esters, e.g., polyvinyl acetate/methyl acrylate, polyvinyl acetate/methyl methacrylate and polyvinylacetate; polyacrylate and polymethacrylate esters, e.g., polymethyl methacrylate; polyvinyl chloride and copolymers, e.g., polyvinyl chloride/acetate; polyvinyl acetals, e.g., polyvinyl formal and polyvinylbutyral; polyurethanes; and polycarbonates.

A preferred class of binder polymers are the novolac phenol-aldehyde condensation resins such as are disclosed in U.S. Pat. No. 3,514,288 which are alkaline soluble.

As has been indicated, solubility in image-exposed areas occurs through an acid-catalyzed decomposition process resulting in image areas which are soluble or dispersible in developing solutions relative to the unexposed parent material. The rate of decomposition can be effectively increased by heating the image-exposed composition at about 120° C. to about 130° C. for about 15 to 20 seconds. This increase in decomposition rate can thus allow a reduction in relative image exposure time required to produce a comparable degree of solubility change in exposed areas.

Developing solutions that may be used in developing the photosolubilizable compositions used in the process of the invention are those which do not dissolve or allow removal of the unexposed photosolubilizable composition but which do dissolve or readily remove the exposed composition. Specific developing solutions that may be used vary according to the particular photosolubilizable composition utilized and some simple rudimentary experimentation may be necessary to determine optimum solvent suitability.

Generally, the solution can be chosen by washing a sample of an exposed photosensitive element prepared in accordance with the herein described procedures with a series of solutions of increasing solubility parameter. A discussion of the solubility parameter of solvents and a list of solvents arranged in order of increasing solubility parameter is given in I & EC Product Research and Development, 8 (1), 2 (1969). The solution is chosen which has a solubility parameter just high enough to allow the exposed areas of the element to dissolve without dissolving the unexposed areas. When compounds containing one or more aromatic hydroxyl groups are utilized in the preparation of the photosolubilizable compositions, exposure to actinic radiation generally forms phenolic type decomposition products. Because of this, dilute aqueous alkaline solutions many times function well in developing these photosolubilizable compositions. This is especially true of compositions also containing film-forming polymeric binders that are alkaline-soluble. Aqueous alkaline solutions containing generally from about 1 to 5 percent of an alkaline compound such as, for example, inorganic alkaline compounds (e.g., disodium phosphate, trisodium phosphate, sodium hydroxide, and ammonium hydroxide), non-volatile organic amines (e.g., triethanolamine) and the like are suitable.

An optimum alkaline concentration level can be determined by first washing an image-exposed layer of the photosolubilizable composition with a weak aqueous alkaline solution, e.g., about one percent alkaline concentration. If the exposed areas do not dissolve, solutions of progressively increasing alkalinity can be attempted until that alkaline concentration is found which dissolves the exposed areas while not affecting the unexposed areas. It may be advantageous to add organic solvents to the aqueous alkaline solutions to obtain better wetting and increased developer selectability, i.e., a broader range of workable alkaline concentrations. Examples of such organic solvents are water-miscible solvents including, for example, methanol, ethanol, n-propyl alcohol, acetone, dioxane, tetrahydrofuran, and dimethylformamide. The exposed composition is readily removable by the developer and the removal may be enhanced by gentle swabbing or rubbing of the area, especially when insoluble components such as pigments are contained therein.

Sensitivity of the photosolubilizable composition to actinic radiation of a particular wavelength range can be increased by the incorporation of known ultraviolet and visible light sensitizers including cyanine, carbocyanine, merocyanine, styryl, acridine, polycyclic aromatic hydrocarbons, polyarylamines, and aminosubstituted chalcones. Suitable cyanine dyes are described in U.S. Pat. No. 3,495,987. Suitable styryl dyes and polyarylamines are described in Light Sensitive Systems, J. Kosar, J. Wiley and Sons (New York, 1965), pages 361-369. Polycyclic aromatic hydrocarbons useful as sensitizers are disclosed in U.S. Pat. No. 3,640,718, an example of which is 2-ethyl-9,10-dimethoxyanthracene. Amino substituted chalcones useful as sensitizers are described in U.S. Pat. No. 3,617,288.

The invention is further illustrated by the following specific examples in which, unless otherwise specified, parts by weight are utilized. The particular compositions or concentrations chosen should not be construed to limit the invention in any way, as many equivalents have been described above and others will be obvious to those practitioners skilled in the art.

EXAMPLE 1

Illustrating the preparation of a positive acting lithographic plate.

A positive-acting photosensitive composition is prepared by mixing the following components in subdued light:

- 100 parts methylethylketone
- 10 parts Alnovol 429K, a cresol-formaldehyde resin available from the American Hoechst Company
- 3 parts bis-2-tetrahydropyranyl ether of 4,4′-isopropylidene diphenol
- 0.3 parts 2,4-bis(trichloromethyl)-6-(4-methoxystyryl)-s-triazine The photosensitive composition is dip-coated onto a silicated Alcoa 3003 aluminum plate made according to U.S. Pat. No. 2,714,066, to a dry coating weight of 100–140 mg./ft.$^2$. The thus sensitized plate may be exposed immediately or stored in the absence of light for extended periods of time before use. The sensitized plate is exposed for 15 seconds through a conventional half-tone positive original and a $\sqrt{2}$ photo-graphic step wedge in a vacuum frame using a reflectorized 90 amp. carbon arc (Graf-Arc) at a distance of 48 inches and then developed by immersing for a few minutes in an aqueous sodium hydroxide solution buffered to a pH of approximately 13 wherein the exposed portions of the image were dissolved. Mechanical scrubbing with a brush or cotton pad may be used but does not hasten the dissolution process appreciably. Reproduction characteristics are described as an open step 3 for the step wedge image, i.e., the first three steps were rendered removable during development, the 3 percent dots were present and not faded, and the 97 percent screens were completely open.

The printing plates prepared in accordance with Example 1 provide in excess of 40,000 prints with no loss of image quality when run in a standard printing press using conventional fountain solutions and press inks.

EXAMPLE 2

Illustrating the preparation of a color transparency, and a positive lithoplate.

A positive acting photosensitive composition is prepared by mixing the following components in subdued light:

- 150 parts ethylene dichloride
- 1.12 parts polyvinyl formal resin, Formvar 12/85 (Monsanto)
- 10 parts bis-2-tetrahydropyranyl ether of 4,4′-sulfonyl diphenol
- 2.25 parts Watchung Red pigment
- 1 part hexabromoethane
- 0.5 part triphenylamine The mixture is ball milled until smooth, coated at a knife setting of two mils on 3 mil polyethylene terephthalate, and allowed to dry. The dry film is exposed through a photographic positive transparency for 30 seconds to the radiation from a 500 watt General Electric H3T7 ultraviolet lamp at a distance of 7 inches. The exposed film is then developed by washing with a mixture of 25 parts of n-propanol, 70 parts of water, and 5 parts of triethanolamine to remove the exposed portions of the coating and leave a positive red image.

When the conditions of Example 2 are repeated using in place of Watchung Red pigment an equal amount of other pigments, there are obtained positive transparencies of any desired color.

When the conditions of Example 2 are repeated with the photosolubilizable composition coated on to a silicated aluminum plate in the place of the polyethylene terephthalate film there is obtained an imaged plate suitable for use as a lithographic printing plate.

EXAMPLE 3

Illustrating photosolubilizable compositions prepared using a polymeric material having pendant acid-degradable groups.

A photosolubilizable composition is prepared by mixing the following components under subdued light until dissolved:

- 200 parts methylene chloride
- 30 parts poly-2-tetrahydropyranyl ether of a phenol-formaldehyde resin (formed by the reaction of phenol-formaldehyde resin, Novolak ET 345/1300, available from the Dow Chemical Co., with dihydropyran in the presence of p-toluene sulfonic acid as a catalyst)
- 2 parts hexabromoethane
- 1 part triphenylamine The photosensitive composition is dip-coated onto a silicated aluminum plate to give a dry coating weight of ca. 100 mg/ft.$^2$ The thus sensitized plate which is stable in the absence of light for extended periods of time, is exposed through a positive transparency for one minute to the radiation from a 500 watt General Electric H3T7 ultraviolet lamp at a distance of 7 inches. The plate is developed by washing out the exposed areas with a solution containing 35 parts n-propyl alcohol, one part potassium hydroxide and 64 parts water. The positive printing plate obtained shows good ink/water balance characteristics with the unexposed areas readily accepting lithographic inks. A similar sensitized plate when exposed through a conventional $\sqrt{2}$ photographic step wedge and developed as above is sufficiently solubilized through the first three steps of the step wedge to be removed during development.

When the conditions of Example 3 are repeated using in place of the hexabromomethane an equivalent amount of 2,4,6-tris(trichloromethyl)-s-triazine with triphenylamine, or 2,4-bis(trichloromethyl)-6-(4-methoxystyryl)-s-triazine without triphenylamine, similar results are obtained.

EXAMPLE 4

Illustrating photosolubilizable compositions prepared using polymeric materials having acid-degradable groups in the backbone of the polymer.

A photosolubilizable composition is prepared by mixing the following components under subdued light:

200 parts methylene chloride
2.0 parts hexabromoethane
0.5 parts 2-ethyl-9,10-dimethoxyanthracene
30 parts of a polymer prepared as described hereinbelow and having about 6 to 20 structural units of the formula:

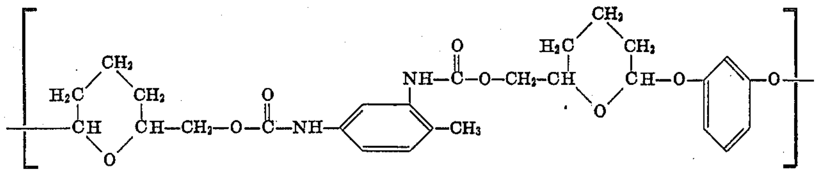

The photosensitive composition is dip-coated onto silicated aluminum to give a dry coating weight of approximately 120 mg./ft.$^2$. On exposure of this plate through a $\sqrt{2}$ photographic step wedge for 1 minute to the radiation from a 500 watt General Electric H3T7 ultraviolet lamp at a distance of 7 inches followed by washing with a developer solution composed of 100 ml. water, 25 ml. of n-propyl alcohol, and 0.5 g. of potassium hydroxide, the coated composition was removed from areas under the first four steps of the step wedge. Lithographic plates made in this manner show good ink/water balance characteristics and print satisfactorily with conventional offset processes.

The polymeric compound having arylacetal groups in the backbone of the polymer is prepared by stirring at 25° C. a solution of 8.0 g. (0.02 mole) of

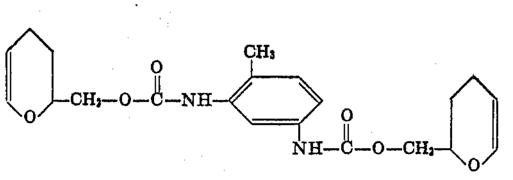

and 2.2 g. (0.02 mole) of resorcinol in 100 ml. of benzene, to which is added 0.25 ml. of diethyl ether saturated with dry hydrogen chloride. After several hours a viscous precipitate begins to separate. After 12 hours, ethyl acetate is added to dissolve the precipitate and the resulting solution is washed with 1 percent aqueous sodium hydroxide and the washed solution dried over anhydrous magnesium sulfate. On evaporation of the solvents, there is obtained 10.4 g. of resinous material which after extraction with anhydrous ether yields 8.5 g. of a white resinous solid having a softening point of about 100° C. This solid exhibits an infrared analysis consistent with a 1:1 polymeric adduct. A gel permeation chromatogram trace of this material calibrated against an anionic polystyrene reference gave values (in angstroms) for $\bar{A}n=106$, $\bar{A}w=211$, and p=2.

EXAMPLE 5

Illustrating the preparation of photosolubilizable compositions using acid-degradable materials which are the addition product of an alkyl vinyl ether and an N-methylaryl-sulfonamide.

A photosensitive composition is prepared by dissolving in a suitable container under subdued light:

200 parts ethylene dichloride
10 parts N-(2-tetrahydropyranyl)-N-ethylben-zene sulfonamide
1 part hexabromoethane
2 parts alkali Red RT-534 pigment (E.I. duPont)
0.5 part triphenylamine The photosensitive composition is knife-coated at a wet thickness of 3 mils onto 3 mil polyester film. After drying overnight at room temperature (about 25° C.) it is exposed through a positive transparency to the radiation from a 500 watt General Electric H3T7 ultraviolet lamp at a distance of 7 inches for 3 minutes. The exposed areas are then washed off with water leaving a positive red image of the unexposed areas.

EXAMPLE 6

Illustrating the use of photosensitive elements to prepare color proofs of separation positives using the photosolubilizable compositions of the invention.

A photosensitive composition is prepared by dissolving under subdued light:

40.0 parts Alnovol 429K, a cresol-formaldehyde resin available from the American Hoechst Co.
12.0 parts bis-2-tetrahydropyranyl ether of 4,4'-isopropylidene diphenol
2.0 parts 2,4-bis(trichloromethyl)-6-(4-methoxystyryl)-s-triazine
200 parts methylethylketone The solution is divided into four equal portions and labeled A, B, C, and D. A series of predispersed pigments in a vinyl resin is commercially available from the Chemetron Corporation of which the following are employed:

Phthalo-Blue V4PB-7413 (2193)
Flavanthrone Yellow Granules VYP4-7385 (2448)
Perylene Red Medium Granules V4PR-7006 (2373)
Carbon-Black Jet Granules V4PK-7301 (2473)

2.5 parts of each are stirred with 10 parts of methylethylketone and stirred into portions A, B, C, and D respectively until a homogeneous mixture is obtained. Solutions A, B, C, and D are then knife coated on a 3 mil polyester film at a thickness of 2 mils wet and allowed to dry at room temperature. The films are exposed through a set of positive color separation photographic originals for 60 seconds using a Colight MVX Exposure Frame Equipped with a General Electric clear mercury H400A33-1/T16 lamp. The exposed regions are washed away using an alkaline solution sold commercially as "AZ-303" (Shipley Company, Inc.) that is diluted 1:4 with water. Appropriate registration and overlap of each color provides a color proof of the original corresponding to the set of separation positives.

EXAMPLE 7

Illustrating a photosolubilizable composition utilizing acid-degradable materials which are the addition product of an alkyl vinyl ether and a secondary aromatic amine. A photosensitive composition is prepared by dissolving in a suitable container under subdued light:

- 10 parts methylethylketone
- 0.3 parts N-(2-tetrahydropyranyl) phenothiazine
- 0.03 parts 2,4-bis(trichloromethyl)-6-(4-methoxystyryl)-s-triazine
- 0.01 parts p-(tricyanovinyl)-N,N-dimethylaniline The photosensitive composition is knife coated at a wet thickness of 2 mills onto 3 mil polyester film. The dried coating is exposed through a positive transparency to a 500 watt General Electric H3T7 ultraviolet lamp at a distance of 7 inches for 30 seconds. The exposed areas are then washed off with a 1:1 solution of ethanol and water which leaves a positive red image in the unexposed areas.

Similar results are obtained by using N-(2-tetrahydropyranyl)-N-($\alpha$-naphthyl)-N-phenylamine in place of N-(2-tetrahydropyranyl)phenothiazine.

EXAMPLE 8

Illustrating a photoresist where a photosolubilizable composition is applied to a metal clad circuit board material.

The following photosolubilizable composition is prepared by mixing the components in a suitable container under subdued light:

- 50.0 parts methylethylketone
- 10.0 parts Alnoval 429K, a cresol-formaldehyde resin available from the American Hoechst Company
- 3.0 parts bis-2-tetrahydropyranyl ether of 4,4'-isopropylidene diphenol
- 0.5 parts 2(p-methoxystyryl)-4,6-bis(trichloromethyl)-s-triazine
- 0.3 parts p-tricyanovinyl-N,N-dimethylaniline The mixture is knife coated on a conventional, one ounce copper clad printed circuit board to a dry weight of 100 mg/ft.$^2$ and exposed for 1 minute through a photographic negative original using a Colight MVX exposure frame (Colight, Inc.) equipped with a General Electric H400A33-1/T16 Mercury lamp. The exposed areas are washed out using a 0.5 percent aqueous sodium hydroxide solution leaving a colored unexposed area for visual inspection. The copper is then etched away using a conventional 42° Baume ferric chloride bath. A circuit pattern having good quality and resolution is obtained.

EXAMPLE 9

Illustrating a photosolubilizable element where image revelation is by adhesive transfer to a receptor sheet.

A photosolubilizable composition is prepared by mixing the following components under subdued light:

- 400 parts ethylene dichloride
- 20 parts bis(2-tetrahydropyranyl)ether of 4,4'-sulfonyl diphenol
- 2 parts hexabromoethane
- 1 part triphenylamine
- 4 parts Alkali Red RT-534 pigment available from the duPont Company.

The pigment is predispersed in the solvent by ball milling prior to addition of the other components. The resulting composition is knife coated at a wet thickness of 2 mils onto 3 mil polyester film. After drying at room temperature, it is exposed for 1 minute through a positive original to the radiation from a 500 watt General Electric H3T7 ultraviolet lamp at a distance of 7 inches.

The image is revealed by laminating an adhesive film to the exposed coating and then peeling apart. The exposed areas remain on the original film to give a negative image and the unexposed areas are transferred to the adhesive layer to form a positive image.

The exposed areas can be transferred to other surfaces, such as aluminum or paper, using a pressure roller.

EXAMPLE 10

Illustrating the preparation of a dry positive film resist product useful for application to a suitable receptor surface.

A photosolubilizable composition is prepared by dissolving under subdued light:

- 100 parts toluene
- 14 parts Alnoval 429K, a cresol-formaldehyde resin available from the American Hoechst Company
- 12 parts Gantrez M555, 50 percent polyvinylmethylether in toluene available from General Avaline Company
- 10 parts bis(2-tetrahydropyranyl)ether of bisphenol A
- 0.45 parts 2,4-bis(trichloromethyl)-6-(4-methoxystyryl)-s-triazine The solution is knife coated at a 4 mil wet thickness onto 4 mil polyethylene film and dried at about 65° C. for 10 minutes.

The positive film resist product is used to prepare an electronic circuit by laminating the resist product to flexible copper clad circuit material. The polyethylene film is readily stripped from the laminate leaving the resist layer bonded to the copper surface. The laminate is covered with a circuit mask and exposed at a distance of 24 inches to a 2,000 watt ultraviolet source for 2.5 min. (Colite, Inc.), and developed with a one percent aqueous sodium hydroxide solution for two minutes.

The exposed copper is then electrolytically plated with gold following standard industrial procedures. The remaining resist is then exposed and washed away with the developer solution. Photomicrographs of the plated patterns showed excellent resolution for the 4 mil lines and 3 mil spacings of the circuit pattern.

The above process can be successfully repeated using polypropylene film as the resist carrier.

Various fillers may be added to the photosolubilizable compositions of the invention as desired, including e.g., $TiO_2$, powdered glass, colloidal carbon, graphite, phosphor particles, ceramics, clays, metal powders such as aluminum, copper, magnetic iron, bronze, immiscible powdered or fibrous natural or synthetic polymers, etc.

Another optional ingredient is a plasticizer which may be incorporated into the photosolubilizable layer to aid in the attainment of desirable properties, e.g., flexibility. Useful plasticizers include dibutyl phthalate, triethylene glycol diacetate, dimethyl sulfoxide, polyethyleneglycol succinate, etc.

What is claimed is:

1. A photosolubilizable composition comprising a. a water-insoluble organic compound containing one or more acid-degradable linkages of the formula

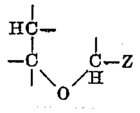

where Z is selected from the group consisting of $-OAr$, $-NRSO_2Ar$,

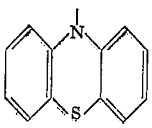

, and

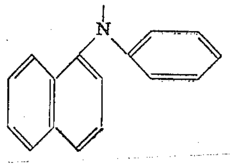

where Ar is a monovalent or divalent aromatic group and R is a lower alkyl group; and b. a photoinitiator comprising a photolyzable acid progenitor which is normally nonreactive but which, upon absorption of actinic radiation, is capable of generating an acid condition, said composition being rendered readily removable by a developing solution in an imagewise manner in areas exposed to actinic radiation, the unexposed areas remaining intact.

2. A photosolubilizable composition comprising:

a. a water-insoluble organic compound containing one or more acid-degradable groups, the group having the formula

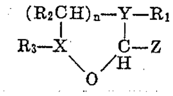

where n is zero, 1, 2, or 3; wherein when n is zero, X and Y are $-CH_2-$ and $R_1$ is hydrogen or lower alkyl; and when n is 1, 2, or 3, X and Y are $-CH-$, $R_1$ is hydrogen, and $R_2$ is hydrogen or lower alkyl; and wherein $R_3$ is hydrogen, a monovalent aliphatic radical, or a divalent organic radical; and Z is selected from the group consisting of $-OAr$, $-NRSO_2Ar$,

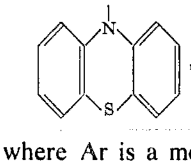

, and

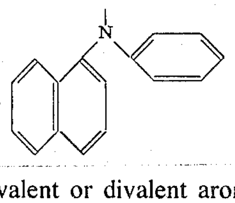

where Ar is a monovalent or divalent aromatic group and R is a lower alkyl group; and b. a photoinitiator comprising a photolyzable acid progenitor which is normally nonreactive but which, upon absorption of actinic radiation, is capable of generating an acid condition, said composition being rendered readily removable by a developing solution in an imagewise manner in areas exposed to actinic radiation, the unexposed areas remaining intact.

3. The composition of claim 2, wherein said water-insoluble organic compound is a nucleophilic addition reaction product of a an organic compound having one alkyl vinyl ether group, and b an aromatic compound selected from the group consisting of phenols, polyhydric phenols, aromatic monoalkyl sulfonamides, phenothiazine, and α-naphthylphenylamine.

4. The composition of claim 3 wherein said alkyl vinyl ether group is a dihydropyran group.

5. The composition of claim 2, wherein said water-insoluble organic compound is a nucleophilic addition reaction product of a an organic compound having more than one alkyl vinyl ether group and b an aromatic compound selected from the group consisting of a phenol, an aromatic monoalkylsulfonamide, phenothiazine, and α-naphthylphenylamine.

6. The composition of claim 5, wherein said alkyl vinyl ether group is a dihydropyran group.

7. The composition of claim 2, wherein said water-insoluble organic compound is a nucleophilic addition reaction of a an organic compound having two alkyl vinyl ether groups and b an aromatic compound selected from the group consisting of dihydroxy aromatic compounds.

8. The composition of claim 7, wherein said alkyl vinyl ether groups are dihydropyran groups.

9. The composition of claim 2, wherein said photoinitiator comprises a substantially neutral and stable photolyzable organic halogen-containing compound.

10. The photoinitiator of claim 9, wherein said organic halogen-containing compound comprises a halomethyl-s-triazine.

11. The photoinitiator of claim 9, wherein said organic halogen-containing compound comprises a photolyzable s-triazine having at least one trihalomethyl group and at least one chromophoric moiety conjugated with the triazine ring by ethylenic unsaturation.

12. The photoinitiator of claim 9, wherein said organic halogen-containing compound comprises a halogen-containing aliphatic, arylaliphatic, or heteroarylaliphatic organic compound.

13. Photosensitive sheet material comprising:

a. a base sheet; and b. overlying said base sheet and in direct contact therewith a photosolubilizable composition comprising:

i. a water-insoluble organic compound containing one or more acid-degradable groups of the formula

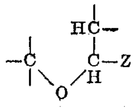

where Z is selected from the group consisting of $-OAr$, $-NRSO_2Ar$,

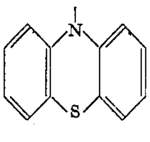

, and

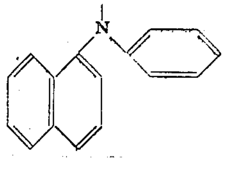

where Ar is nomovalent or divalent aromatic group and R is a lower alkyl group; and ii. a photoinitiator comprising a photolyzable acid progenitor which is normally nonreactive but which, upon absorption of actinic radiation, is capable of generating an acid condition, said composition being rendered readily removable by a developing solution in an imagewise manner in areas exposed to actinic radiation, the unexposed areas remaining intact.

14. Photosensitive sheet material comprising:

a. a base sheet; and b. overlying said base sheet and in direct contact therewith a photosolubilizable composition comprising:

i. a water-insoluble organic compound containing one or more acid-degradable groups of the formula

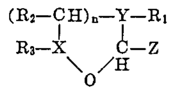

where n is zero, 1, 2, or 3; wherein when n is zero, X and Y are $-CH_2-$ and $R_1$ is hydrogen, and $R_2$ is hydrogen or lower alkyl; and wherein $R_3$ is hydrogen, a monovalent aliphatic radical, or a divalent organic radical; and Z is selected from the group consisting of $-OAr$, $-NRSO_2Ar$,

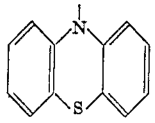
, and
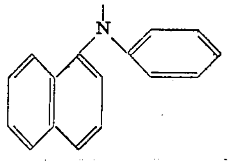

where Ar is a monobalent or divalent aromatic group and R is a lower alkyl group; and ii. a photoinitiator comprising a photolyzable acid progenitor which is normally nonreactive but which, upon absorption of actinic radiation, is capable of generating an acid condition, said composition being rendered readily removable by a developing solution in an imagewise manner in areas exposed to actinic radiation, the unexposed areas remaining intact.

15. The photosensitive sheet material of claim 14 wherein said base sheet is metal.

16. The photosensitive sheet material of claim 14 wherein said base sheet is transparent and dimensionally stable.

17. The photosensitive sheet material of claim 14 wherein said water-insoluble organic compound is a nucleophilic addition reaction product of a an organic compound having one alkyl vinyl ether group, and b an aromatic compound selected from the group consisting of phenols, polyhydric phenols, aromatic monoalkyl sulfonamides, phenothiazine, and $\alpha$-naphthyl-phenyl amine.

18. The photosensitive sheet material of claim 17 wherein said alkyl vinyl ether group is a dihydropyran group.

19. The photosensitive sheet material of claim 14 wherein said water-insoluble organic compound is a nucleophilic addition reaction product of a an organic compound having more than one alkyl vinyl ether group and b an aromatic compound selected from the group consisting of a phenol, an aromatic monoalkylsulfonamide, phenothiazine, and $\alpha$-naphthyl phenyl amine.

20. The photosensitive sheet material of claim 19 wherein said alkyl vinyl ether group is a dihydropyran group.

21. The photosensitive sheet material of claim 14 wherein said water-insoluble organic compound is a nucleophilic addition reaction of a an organic compound having two alkyl vinyl ether groups and b an aromatic compound selected from the group consisting of dihydroxy aromatic compounds.

22. The photosensitive sheet material of claim 21 wherein said alkyl vinyl ether groups are dihydropyran groups.

23. The photosensitive sheet material of claim 14 wherein said photoinitiator comprises a substantially neutral and stable photolyzable organic halogen-containing compound.

24. The photoinitiator of claim 23 wherein said organic halogen-containing compound comprises a halomethyl-s-triazine.

25. The photoinitiator of claim 23 wherein said organic halogen-containing compound comprises a photolyzable s-triazine having at least one trihalomethyl group and at least one chromophoric moiety conjugated with the triazine ring by ethylenic unsaturation.

* * * * *

UNITED STATES PATENT OFFICE
CERTIFICATE OF CORRECTION

Patent No. 3,779,778 Dated December 18, 1973

Inventor(s) George H. Smith and James A. Bonham

It is certified that error appears in the above-identified patent and that said Letters Patent are hereby corrected as shown below:

The formula in Claim 1, Col. 17 should read:

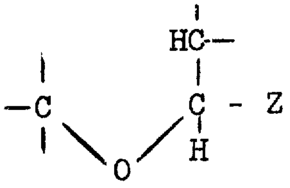

instead of

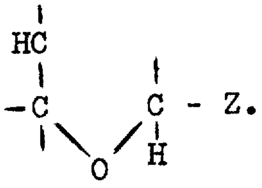

Col. 19, line 1 should read "monovalent" instead of "nomovalent".

Col. 19, line 39 should read "monovalent" instead of "monobulent".

Signed and sealed this 4th day of June 1974.

(SEAL)
Attest:

EDWARD M.FLETCHER,JR.
Attesting Officer

C. MARSHALL DANN
Commissioner of Patents

ORM PO-1050 (10-69)

USCOMM-DC 60376-P69
★ U.S. GOVERNMENT PRINTING OFFICE : 1969 O—366-334.